(12) United States Patent  
Qin et al.

(10) Patent No.: US 8,552,292 B2
(45) Date of Patent: Oct. 8, 2013

(54) SYSTEM AND METHOD FOR OVERMOLDING OF DECORATED PLASTIC PARTS

(75) Inventors: Jeff Qin, GuangZhou (CN); Charles R. Hill, Loudonville, OH (US); Suriaprakash Narotamo, Queluz (PT); Levin Li, Guangdong (CN); Spring Wu, Zhuhai (CN); Zhong Wang, Zhuhai (CN)

(73) Assignee: Flextronics AP, LLC, Broomfield, CO (US)

( * ) Notice: Subject to any disclaimer, the term of this patent is extended or adjusted under 35 U.S.C. 154(b) by 329 days.

(21) Appl. No.: 12/928,508

(22) Filed: Dec. 13, 2010

(65) Prior Publication Data

US 2011/0180294 A1  Jul. 28, 2011

Related U.S. Application Data

(60) Provisional application No. 61/285,772, filed on Dec. 11, 2009.

(51) Int. Cl.
*H05K 5/00* (2006.01)
*B29C 39/12* (2006.01)

(52) U.S. Cl.
USPC .......... 174/50; 174/520; 174/559; 455/575.8; 264/250

(58) Field of Classification Search
USPC . 174/50, 520, 66, 67, 559, 565; 220/3.2–3.9, 220/4.02, 241, 242; 455/90.3, 575.1, 575.8; 428/35.7; 264/241, 400, 250, 78; 361/679.56, 361/679.02
See application file for complete search history.

(56) References Cited

U.S. PATENT DOCUMENTS

| | | | |
|---|---|---|---|
| 6,492,589 B1 * | 12/2002 | Smith | 174/50 |
| 7,003,267 B2 | 2/2006 | Ward et al. | |
| 7,947,900 B2 * | 5/2011 | Cheng et al. | 174/50 |
| 2007/0048470 A1 | 3/2007 | Zadesky et al. | |
| 2009/0186758 A1 | 7/2009 | Ukpabi | |

OTHER PUBLICATIONS

PCT Application No. PCT/US2010/003152, IDS and WO dated Feb. 10, 2011.

* cited by examiner

*Primary Examiner* — Angel R Estrada
(74) *Attorney, Agent, or Firm* — Haverstock & Owens, LLP

(57) ABSTRACT

An electronic device enclosure includes a first structural layer having a first surface and a second surface. A decorative feature is formed on the first surface of the first structural layer. The enclosure further includes a second structural layer, which is formed directly on the first surface of the first structural layer. The second structural layer is formed over the decorative feature by an overmolding process.

30 Claims, 14 Drawing Sheets

SYSTEM AND METHOD FOR OVERMOLDING OF DECORATED PLASTIC PARTS

RELATED APPLICATIONS

This application claims the benefit of priority to U.S. Provisional Patent Application Ser. No. 61/285,772, filed Dec. 11, 2009 by the same inventors and entitled "System And Method For Overmolding Of Decorated Plastic Parts," which is incorporated by reference herein in its entirety.

BACKGROUND OF THE INVENTION

1. Field of the Invention

This invention relates generally to molded plastic parts, and more particularly to the manufacturing and design of overmolded plastic parts having decorative features.

2. Description of the Background Art

Currently, the demand for electronic devices (e.g., computers, cellular phones, PDA's, etc.) is becoming increasingly more dependent on aesthetics. Of course, much of the overall aesthetic appeal of such a device is influenced by its enclosure (e.g., housings, battery covers, bezels, etc.) design. Accordingly, more and more emphasis is being put into the enclosure design of such products.

Typically, electronic device enclosures are formed by a single injection molding process wherein both the rigid structural features and exterior surfaces are formed simultaneously from the same melt. Although traditional enclosures function adequately and can be manufactured very efficiently, they appear outdated and, therefore, have little appeal in the modern consumer electronic market.

In efforts to improve the appearance of enclosures, manufacturers have implemented many different plastic decoration technologies. For example, painting, pad/screen printing, dye sublimation, vacuum metallization, plating, and laser marking are some of the known plastic decoration technologies used by manufacturers to color and/or form decorative features (e.g., logos, design decals, patterns, etc) on the outer exterior surfaces of enclosures.

Although such decorative features can improve the appearance of enclosures, there are drawbacks and/or significant limitations. For example, when decorative features are applied to the outer exterior surface of an enclosure, a protective hard-coating must be formed over the decorative features, because the features are extremely vulnerable to abrasive damage, even during relatively light use. Of course, such wear substantially degrades the appearance of the enclosure, particularly when it results in the visibility of the underlying molded plastic.

What is needed, therefore, is an improved design and method for manufacturing device enclosures having decorative features. What is also needed is a design and method for applying decorative features to products without the need for hard-coating.

SUMMARY

The present invention overcomes the problems associated with the prior art by providing a design and method for manufacturing device enclosures having decorative features. The invention facilitates applying decorative features to products without the need for hard-coating.

An electronic device enclosure includes a first structural layer having a first surface and a second surface. A decorative feature is formed on the first surface of the first structural layer. The enclosure further includes a second structural layer, which is formed directly on the first surface of the first structural layer. The second structural layer is formed over the decorative feature by an overmolding process.

In one example embodiment, the first structural layer is formed from plastic by molding and is opaque. The second surface of the first structural layer defines an inner exterior surface of said electronic device enclosure. The second structural layer is light transmissive and defines an outer exterior surface of the electronic device enclosure opposite said inner exterior surface of the electronic device enclosure. The decorative feature is formed by laser marking. Optionally, the decorative feature is formed by dye sublimation. The decorative feature can be visible through the second structural layer. The first structural layer is opaque and can be visible through said second structural layer.

Optionally, the first structural layer is light transmissive and the second structural layer is opaque. In that example embodiment, the first structural layer is formed of plastic by molding. The second surface of said first structural layer defines an outer exterior surface of the electronic device enclosure. The second structural layer defines an inner exterior surface of the electronic device enclosure opposite the outer exterior surface of said electronic device enclosure. The decorative feature is formed by laser marking or dye sublimation and is visible through said second surface of said first structural layer. The second structural layer can also be visible through said first structural layer.

Methods for manufacturing an electronic device enclosure are also disclosed. One example method includes providing a first substrate material, providing a second substrate material, forming the first substrate material into a first structural layer of the device enclosure (the first structural layer having a first surface and an opposite second surface), forming a decorative feature on the second surface of the first structural layer, and forming a second structural layer of the device enclosure by overmolding the second substrate material on the second surface of the first structural layer of the device enclosure. The second structural layer defines a first exterior surface of the device enclosure. The decorative feature is disposed between the first structural layer of the device enclosure and the second structural layer of the device enclosure.

In a particular method, said step of forming the first structural layer includes providing a first mold assembly including a first mold core and a first mold cavity, closing the first mold assembly, and depositing the first substrate material in the first mold assembly. The step of forming said second structural layer includes providing a second mold assembly including a second mold cavity and a second mold core, positioning the first structural layer in the second mold assembly after the step of forming the decorative feature, closing the second mold assembly, and depositing the second substrate material in the second mold assembly.

The first mold core is contoured to define the first surface of the first structural layer, and the first mold cavity is contoured to define the second surface of the first structural layer. The second mold cavity is contoured to define a first surface of the second structural layer, and the first surface of the second structural layer defines an outer exterior surface of the device enclosure.

Alternatively, the first mold cavity is contoured to define the first surface of the first structural layer, and the first surface of the first structural layer defines an outer exterior surface of the device enclosure. In this alternate method, the first mold core is contoured to define the second surface of the first structural layer, and the second mold core is contoured to define a first surface of the second structural layer. The first surface of the second structural layer defines an inner exterior surface of the device enclosure.

In a particular example method, the step of forming the decorative feature includes providing a mounting fixture, mounting the first structural layer in the mounting fixture (after the first structural layer is formed in the first mold assembly and removed from the first mold assembly), and forming the decorative feature on the second surface of the first structural layer while the first structural layer is mounted in the fixture. Optionally, the step of forming the decorative feature includes forming the decorative feature by laser etching, dye sublimation, or any other suitable means now known or yet to be discovered.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art by providing a design and method for manufacturing device enclosures having decorative features without the need for hard-coating. In the following description, numerous specific details are set forth (e.g., sample part design) in order to provide a thorough understanding of the invention. Those skilled in the art will recognize, however, that the invention may be practiced apart from these specific details. In other instances, details of well known molding practices (e.g., routine optimization) and equipment have been omitted, so as not to unnecessarily obscure the present invention.

Figure 1:
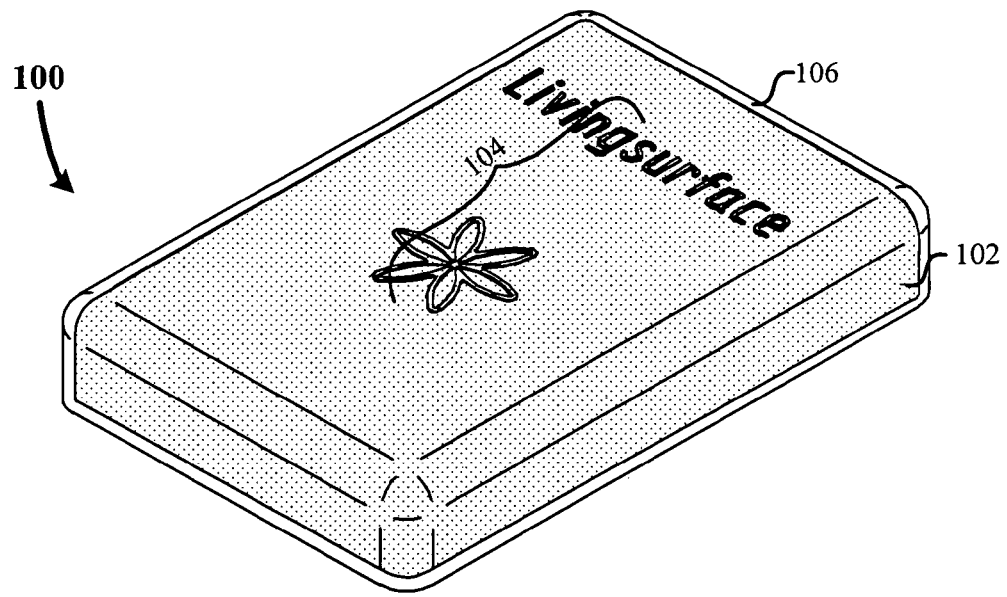
FIG. 1 is a perspective view of an electronic device enclosure 100 according to one embodiment of the present invention.

FIG. 1 shows a perspective view of an electronic device enclosure 100 according to one embodiment of the present invention. Enclosure 100 includes a first structural layer 102, a decorative feature 104, and second structural layer 106. First structural layer 100 is an opaque base layer material which, in this particular example, is moldable plastic. Decorative feature 104 represents any type decorative feature (e.g., logo, decal, label, message, pattern, etc.) that would be desirable to display on an enclosure. In this particular embodiment, decorative feature is formed directly on first structural layer 100 by some suitable means such as, for example, painting, pad/screen printing, dye sublimation, vacuum metallization, plating, laser marking, etc. Although decorative feature 104 can be formed by any suitable means, good results are achieved using laser marking and dye sublimation techniques. Second layer 106 is a light transmissive (e.g., transparent, translucent, etc.) plastic layer that is formed directly on first structural layer 102, over decorative feature 104. Accordingly, decorative feature 104 and first structural layer 102 are visible through second structural layer 106. This gives enclosure 100 an attractive appearance and also functions as a means to protect layer 102 and decorative feature 104 from damage (e.g., scratching, peeling, dulling, etc.).

Figure 2:
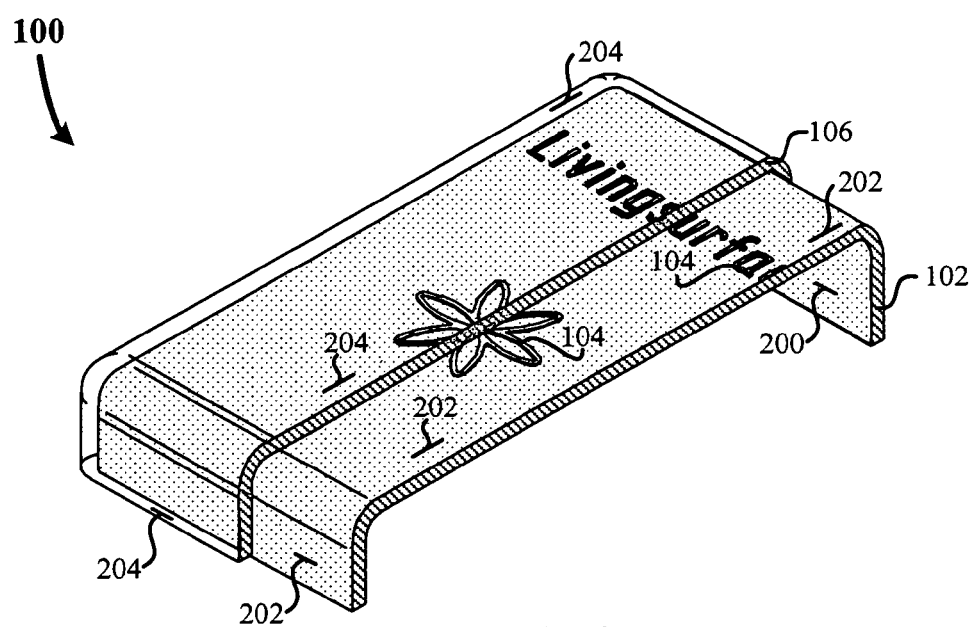
FIG. 2 is a sectioned perspective view of the electronic device enclosure 100 of FIG. 1.

FIG. 2 shows a perspective view of enclosure 100 sectioned through layers 102 and 106 to show details not visible in FIG. 1. Layer 102 includes a first surface 200 and an opposite second surface 202. First surface 200 defines an interior surface of enclosure 100 that would not likely be visible when enclosure 100 is mounted on an assembled device. Although not shown, surface 200 could define various features such as mounting features (e.g., screw bosses, snap latches, fastener insert seats, etc.), assembly alignment features (e.g., studs/channels, component recesses, etc.), and support features (e.g., ribs, support columns, etc.). Second surface 202 of layer 102 is visible through layer 106 and provides an area whereon both decorative feature 102 and layer 106 are formed. Of course, decorative feature 104 is formed on second surface 202 before second layer 106 such that second layer 106 covers and protects decorative feature 104. Second layer 106 includes a first surface 204 that defines the exterior surface of enclosure 100.

Figure 3:
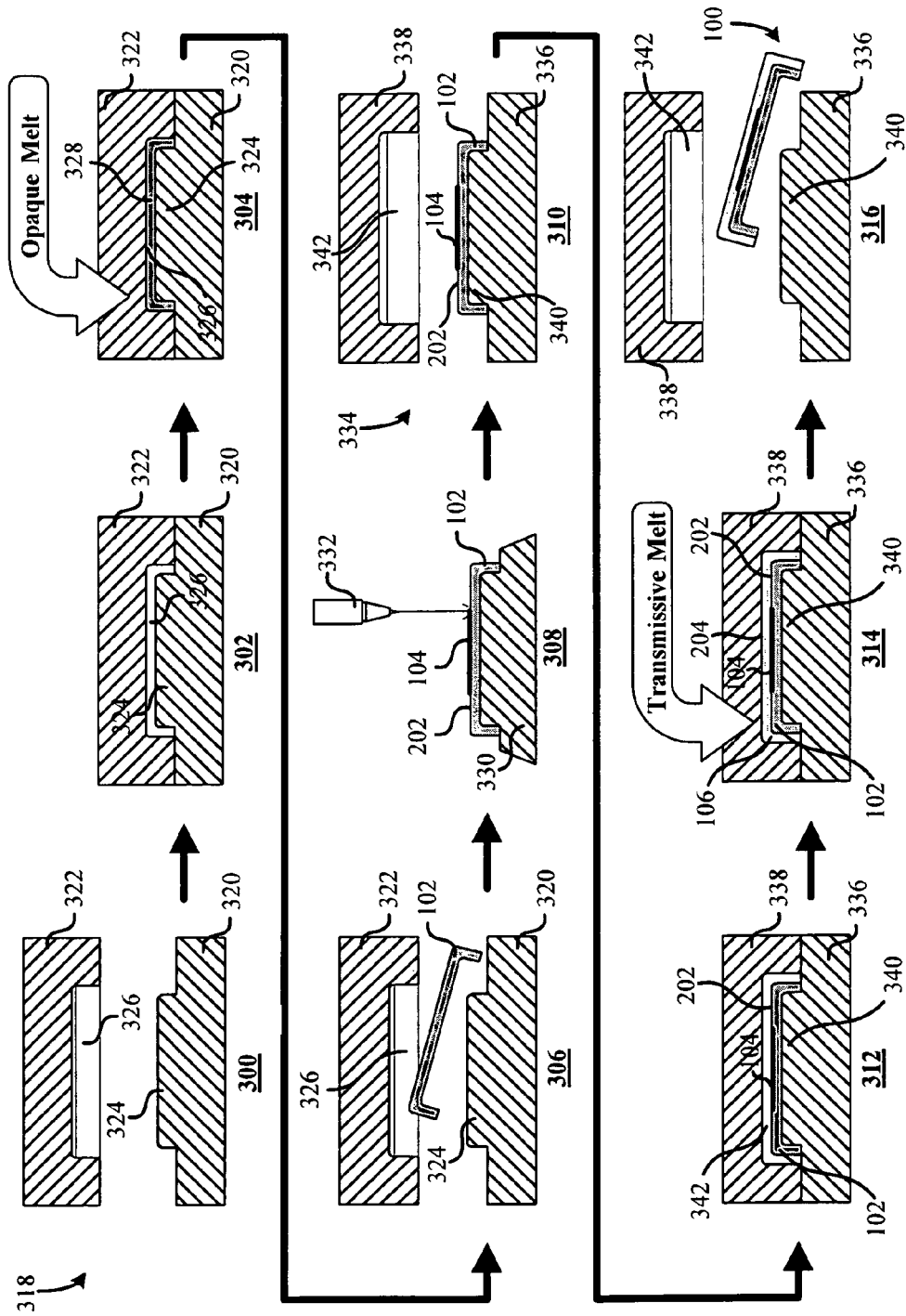
FIG. 3 is flow diagram illustrating a sequence of stages for manufacturing the electronic device enclosure 100 of FIG. 1 according to an example method of the present invention.

FIG. 3 is a process flow-diagram illustrating a method for manufacturing enclosure 100 according to one embodiment of the present invention. The example method is illustrated through a sequence of processes 300, 302, 304, 306, 308, 310, 312, 314, and 316.

In process 300, a first mold assembly 318 is provided. Mold assembly 318 includes a first core side 320 and an associated first cavity side 322. Core side 320 includes a core 324 that is contoured to define first surface 200 of first layer 102. Cavity side 322 includes a cavity 326 that is contoured to define second surface 202 of first layer 102.

Next, in process 302, mold assembly 318 is arranged in a closed position wherein core side 320 and cavity side 322 are held together. As shown, core 224 has a slightly lesser volume than that of cavity 326 such that a region of cavity 326 remains unoccupied by core 326 when mold assembly 318 is closed.

Then, in process 304, opaque plastic melt is deposited into the unoccupied region of cavity 326 by, for example, injecting the melt through sprues formed in mold assembly 318. After the plastic is deposited, the mold assembly 318 is kept closed while the deposited plastic cools to a predetermined temperature at which it solidifies into first layer 102.

Next, in process 306, mold assembly 318 is opened and first layer 102 is removed.

Then, in process 308, first layer 102 is held in a fixed position by a mounting fixture 330 while decorative feature 104 is formed on second surface 202 by a decorative feature application device 332. Note that decorative feature application device 332 can be any type of device or assembly of devices suitable for applying decorative features and is, therefore, representational in character only. For example, device 332 could be a laser marking device, dye sublimation head, mechanical etcher, and/or even a pick-and-place machine for applying decorative features in the form of pre-formed elements such as stickers.

In the next process 310, a second mold assembly 334 is provided and decorated first layer 102 is positioned therein in preparation for the subsequent overmolding of second layer 106. Second mold assembly 334 includes a core side 336 and an associate cavity side 338. Core side 336 includes a core 340 whereon first layer 102 is seated. Cavity side 338 includes a cavity 342 contoured to define first surface 204 of second layer 106 which, as previously mentioned, is the outer exterior surface of enclosure 100.

Then, in process 312, mold assembly 334 is closed and clamped with first layer 102 being positioned in cavity 342. As shown, a separation exists between second surface 202 and the walls of cavity 342 when mold assembly 334 is closed. This separation defines the space wherein second layer 106 is molded.

In the next process 314, second layer 106 is formed by overmolding light transmissive plastic over first layer 102 and decorative feature 104. That is, light transmissive plastic melt is deposited into mold assembly 334 so as to occupy the space between second surface 202 and the walls of cavity 342. Then, mold assembly 334 is kept closed while the deposited plastic cools to a predetermined temperature at which it solidifies into second layer 106.

In a final process 316, mold assembly 334 is opened and enclosure 100 is removed. The removal of mold assembly 334 can be achieved by any suitable means such as, for example, an ejector pin, manually, etc.

As shown in FIG. 3, three separate mold cores 320, 330, 336 are shown. However, the entire sequence of processes 300, 302, 304, 306, 308, 310, 312, 314, and 316 can be carried out using a single mold core (e.g., mold core 320), thereby eliminating the need to remove first layer 102 from the core until the entire process is complete.

Figure 4:
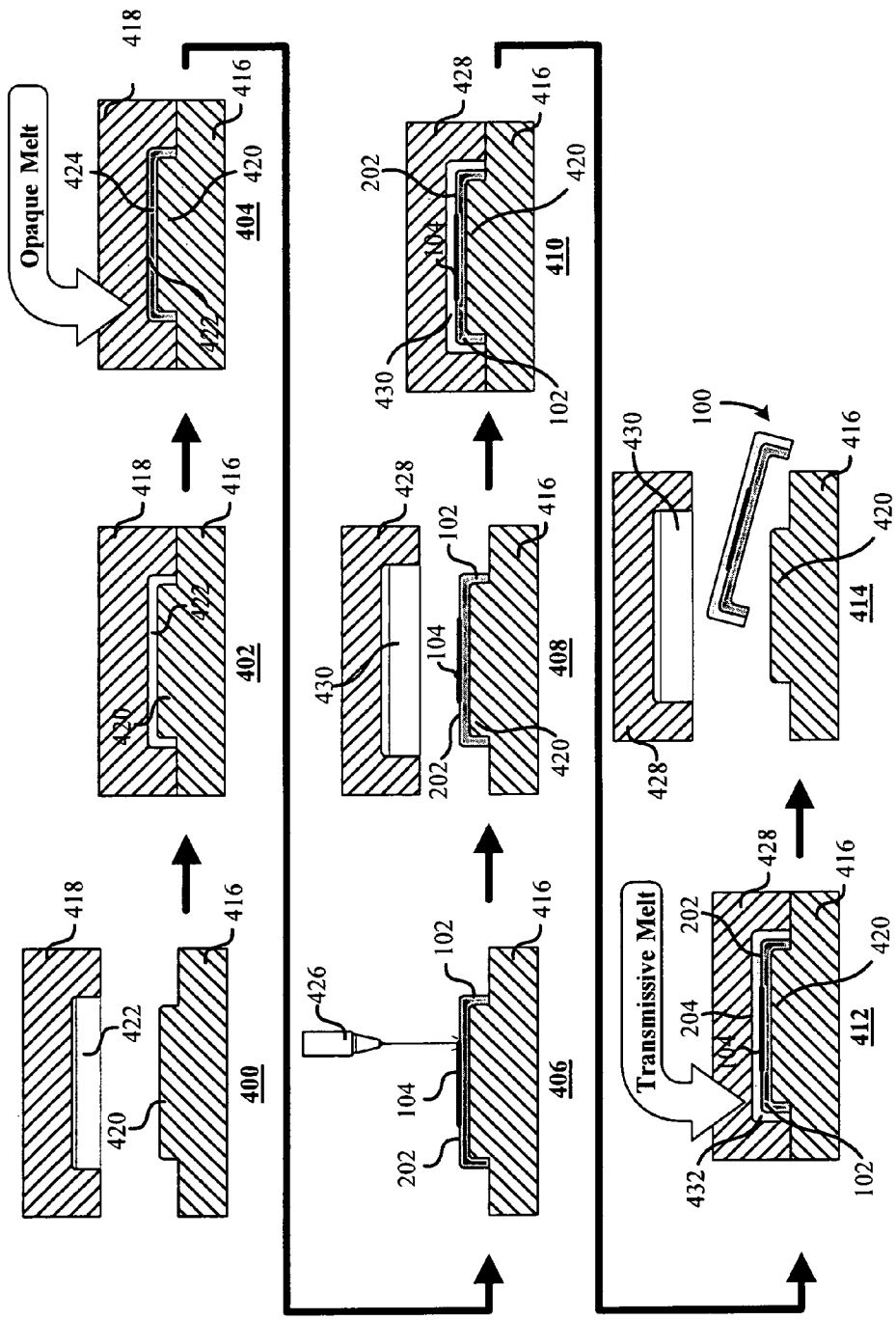
FIG. 4 is flow diagram illustrating a sequence of stages for manufacturing the electronic device enclosure 100 of FIG. 1 according to an example method of the present invention.

FIG. 4 is a process flow-diagram illustrating an alternate method for manufacturing enclosure 100. The example method is illustrated through a sequence of processes 400, 402, 404, 406, 408, 410, 412, and 414.

In process 400, a first core side 416 and an associate first cavity side 418 is provided. Core side 416 includes a core 420 that is contoured to define first surface 200 of first layer 102. Cavity side 418 includes a cavity 422 that is contoured to define second surface 202 of first layer 102.

Next, in process 402, core side 416 and cavity side 418 are assembled into a closed position wherein core 420 occupies a occupies a region of cavity 422

Then, in process 404, opaque plastic melt is deposited into the unoccupied region of cavity 422.

After the plastic is deposited, Core side 416 and cavity side 418 remain in a closed position until the deposited plastic cools to a predetermined temperature at which it solidifies into first layer 102.

Next, in process 406, cavity side 418 is removed from first layer 102 and decorative feature 104 is formed on second surface 202 by a decorative feature application device 426. Note that decorative feature application device 426 can be any type of device or assembly of devices suitable for applying decorative features and is, therefore, representational in character only. For example, device 426 could be a laser marking device, dye sublimation head, mechanical etcher, and/or even a pick-and-place machine for applying decorative features in the form of pre-formed elements such as stickers.

In the next process 408, a second cavity side 428 is provided and positioned with respect to first core side 416. Cavity side 428 includes a cavity 430 contoured to define first surface 204 of second layer 106 which, as previously mentioned, is the outer exterior surface of enclosure 100.

Then, in process 410, core side 416 and cavity side 428 are assembled and arranged in a closed position around first layer 102. As shown, a separation exists between second surface 202 and the walls of cavity 430 when core side 416 and cavity side 428 are arranged in a closed position. This separation defines the space wherein second layer 106 is molded.

In the next process 412, second layer 106 is formed by overmolding light transmissive plastic over first layer 102 and decorative feature 104. That is, light transmissive plastic melt is deposited into the space between second surface 202 and the walls of cavity 430. Then, core side 416 and cavity side 428 are kept closed while the deposited plastic cools to a predetermined, temperature at which it solidifies into second layer 106.

In a final process 414, core side 416 and cavity side 428 are opened and enclosure 100 is removed. The removal of enclosure 100 can be achieved by any suitable means such as, for example, an ejector pin, manually, etc.

Figure 5:
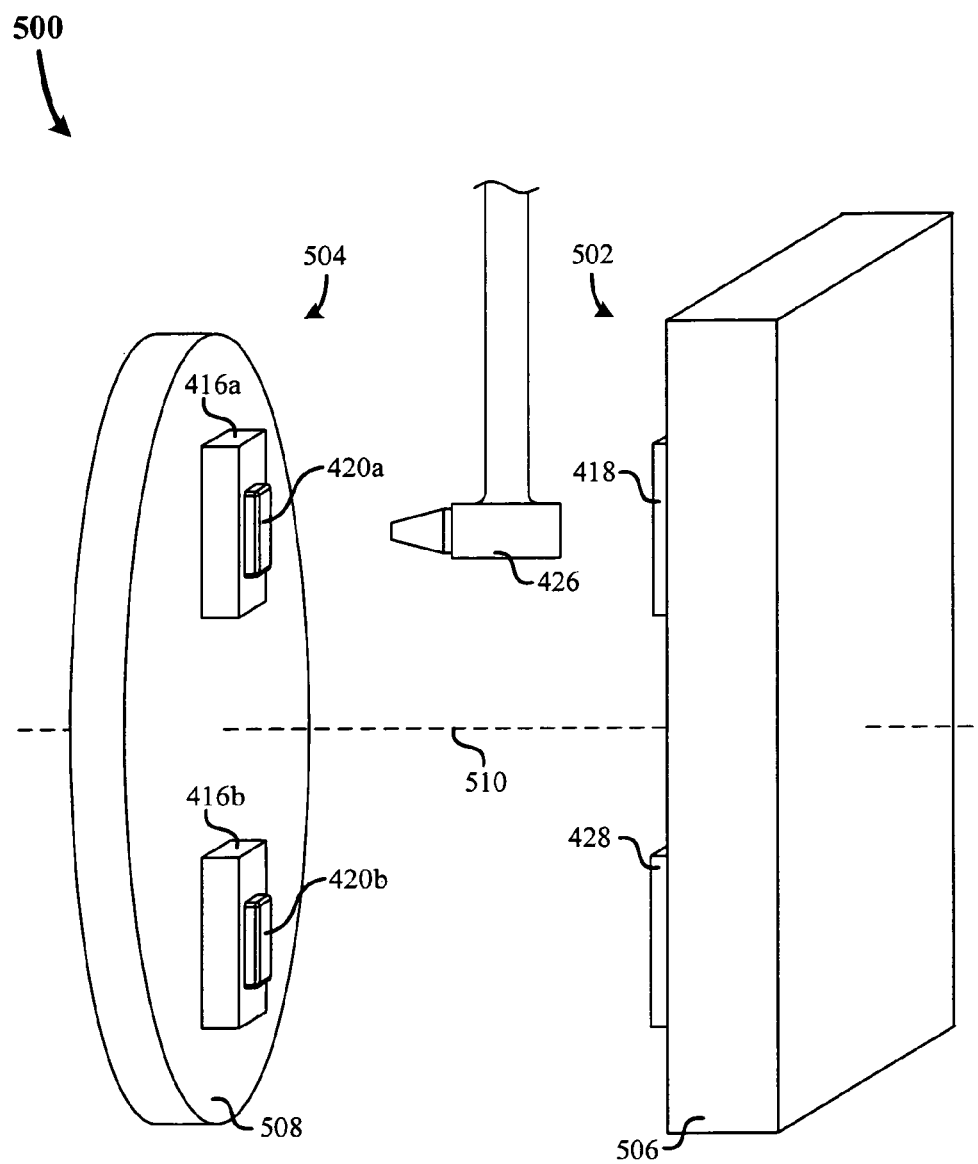
FIG. 5 is a perspective view of a double-shot rotary table molding machine 500 for manufacturing the electronic device enclosure 100 of FIG. 1.

FIG. 5 shows a perspective view of a double-shot rotary table molding machine 500 operative to manufacture enclosures 100 according to the method of FIG. 4. Molding machine 500 includes a stationary assembly 502, a rotatable assembly 504, and decorative feature application device 426. Stationary assembly 502 includes cavity side 418 and cavity side 428 fixably mounted on a stationary support plate 506. Rotatable assembly 504 includes two of mold cores 416 (denoted a and b) fixably mounted on a rotatable table 508. During various operating stages of machine 500, stationary plate 506 remains fixed and centered with respect to an axis 510 while table 510 rotates about, and moves along, axis 510.

An example operating cycle of machine 500 is provided, assuming that one first layer 102 has already been formed and decorated on core side 416b. With a decorated first layer 102 positioned on core 420b, rotatable table 508 is positioned such that core sides 416a and 416b are aligned across from and facing cavity sides 418 and 428, respectively. Then, table 508 is arranged in a first closed position by moving it along axis 510 toward plate 506 until cores 420a and 420b are positioned in cavities 422 and 430 (not visible), respectively. Then, while in the first closed position, a light transmissive plastic material is deposited into cavity 428 over the previously formed and decorated first layer 102 so as to form a second layer 106 of an enclosure 100. At the same time, an opaque plastic material is deposited in cavity 418 so as to form a first layer of another enclosure 100. Then, table 508 is moved back along axis 510 into an open position wherein a completed enclosure 100 is formed over core 420b and a first layer 102 of another enclosure 100 is formed on core 420a. The completed enclosure is then removed while decoration application device 426 is positioned with respect to core side 416 and applies a decorative feature 104 on a first surface 202 of the first layer 102 of the other enclosure 100. Then, table 508 is rotated 180 degrees such that core sides 416a and 416b are aligned across from and facing cavity sides 428 and 418, respectively. Next, table 508 is arranged in a second closed position by moving it along axis 510 toward plate 506 until cores 420a and 420b are positioned in cavities 430 and 422 (not visible), respectively. Then, while in the second closed position, a light transmissive plastic material is deposited into cavity 428 over the previously formed and decorated first layer 102 so as to form a second layer 106 of an enclosure 100. At the same time, an opaque plastic material is deposited in cavity 418 so as to form yet another first layer of yet another enclosure 100. Then, table 508 is moved back along axis 510 into an open position wherein a completed enclosure 100 is formed over core 420a and a first layer 102 of another enclosure is formed on core 420b. The completed enclosure 100 is then removed while decoration application device 426 applies a decorative feature 104 on yet another first layer 102 that will eventually undergo the same cycle.

Figure 6:
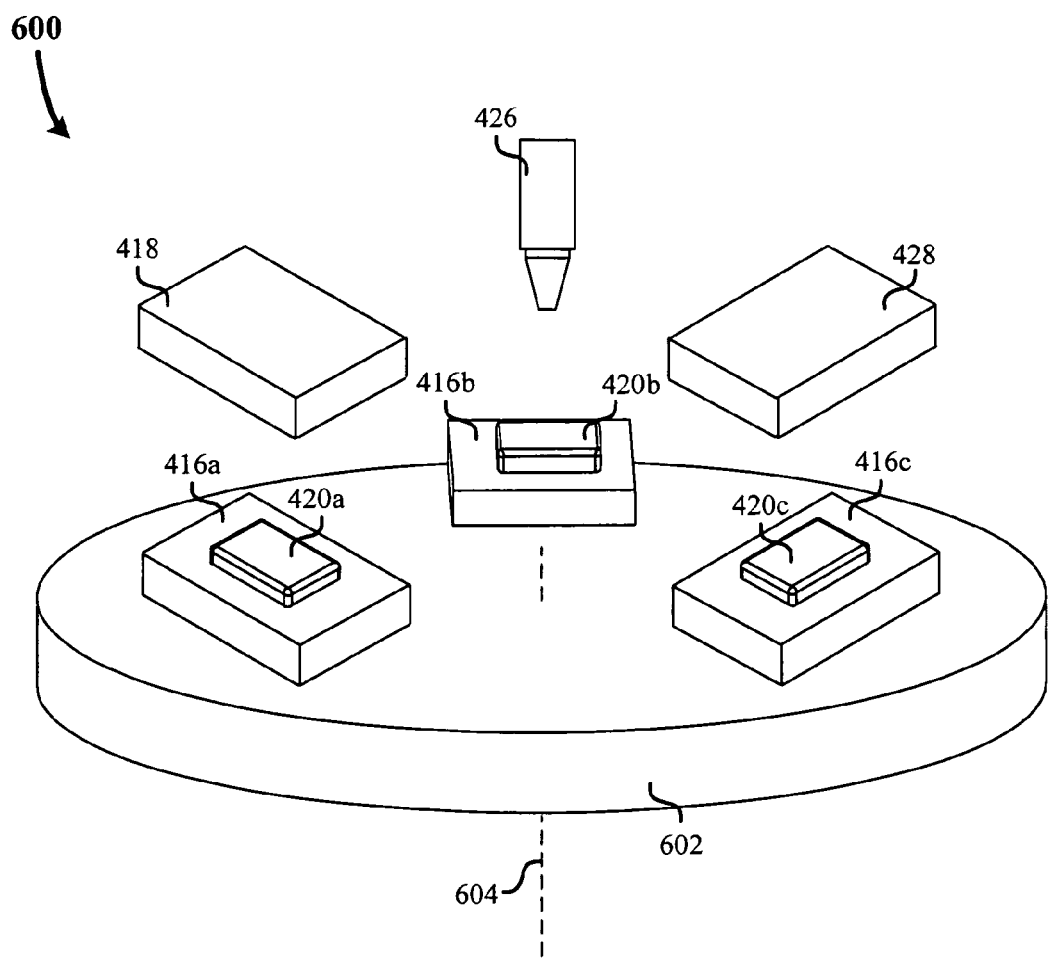
FIG. 6 is a perspective view of a three-position rotary table molding machine 600 for manufacturing the electronic device enclosure 100 of FIG. 1.

FIG. 6 shows a perspective view of a three-position rotary table molding machine 600 operative to manufacture enclosures 100 according to the method of FIG. 4. Molding machine 600 includes a rotary table 602 whereon three identical mold cores 416a, 416b, and 416c are fixably mounted. Rotary table 602 is operative to sequentially change from a first position, to a second position, and then to a third position by rotating about an axis 604. When a core is arranged in the first position, it is aligned with cavity side 418 so as to form first layer 102. When a core is arranged in the second position, it is aligned with decorative feature application device 426 so as to form a decorative feature on the previously formed first layer 102. When a core is arranged in the third position, it is aligned with cavity side 428 so as to form second layer 106 over the previously formed and decorated first layer 102.

An example operating cycle of machine 600 is provided. First, table 604 is arranged such that core sides 416a is in the first position, core side 416b is in the second position, and core side 416c is in the third position. Cavity sides 418 is assembled with core side 416a and opaque plastic is deposited into cavity 422 so as to form a first layer 102 on core 420a. Then, after the opaque plastic solidifies, cavity side 418 is raised off of first layer 102 and core side 416a. Then, table 602 is adjusted a degree such that core sides 416a is in the second position, core side 416b is in the third position, and core side 416c is in the first position. Once core side 416a, having layer 102 formed thereon, is in the second position, decorative feature application device 426 applies a decorative feature 104 onto first surface 202 of first layer 106. After decorative feature 104 is formed, table 602 is adjusted for another degree such that core side 416a is in the third position. Then, cavity side 428 is assembled on core side 416a and light transmissive material is deposited into cavity 430 so as to overmold second layer 106 over decorated first layer 102. Then, cavity side 428 is raised and the completed enclosure 100 is removed. Note that table 106 includes three core sides such that three different enclosures 100 can be undergoing fabrication at the same time. For example, while a first layer is being formed on one cavity, another first layer on a second cavity could be undergoing decoration at the second position, and another decorated first layer positioned on the third core could be undergoing the overmolding of the second layer. Accordingly, when machine 500 operates at full capacity, a completed enclosure can be yielded every time table 604 transitions from one degree to the next.

Figure 7:
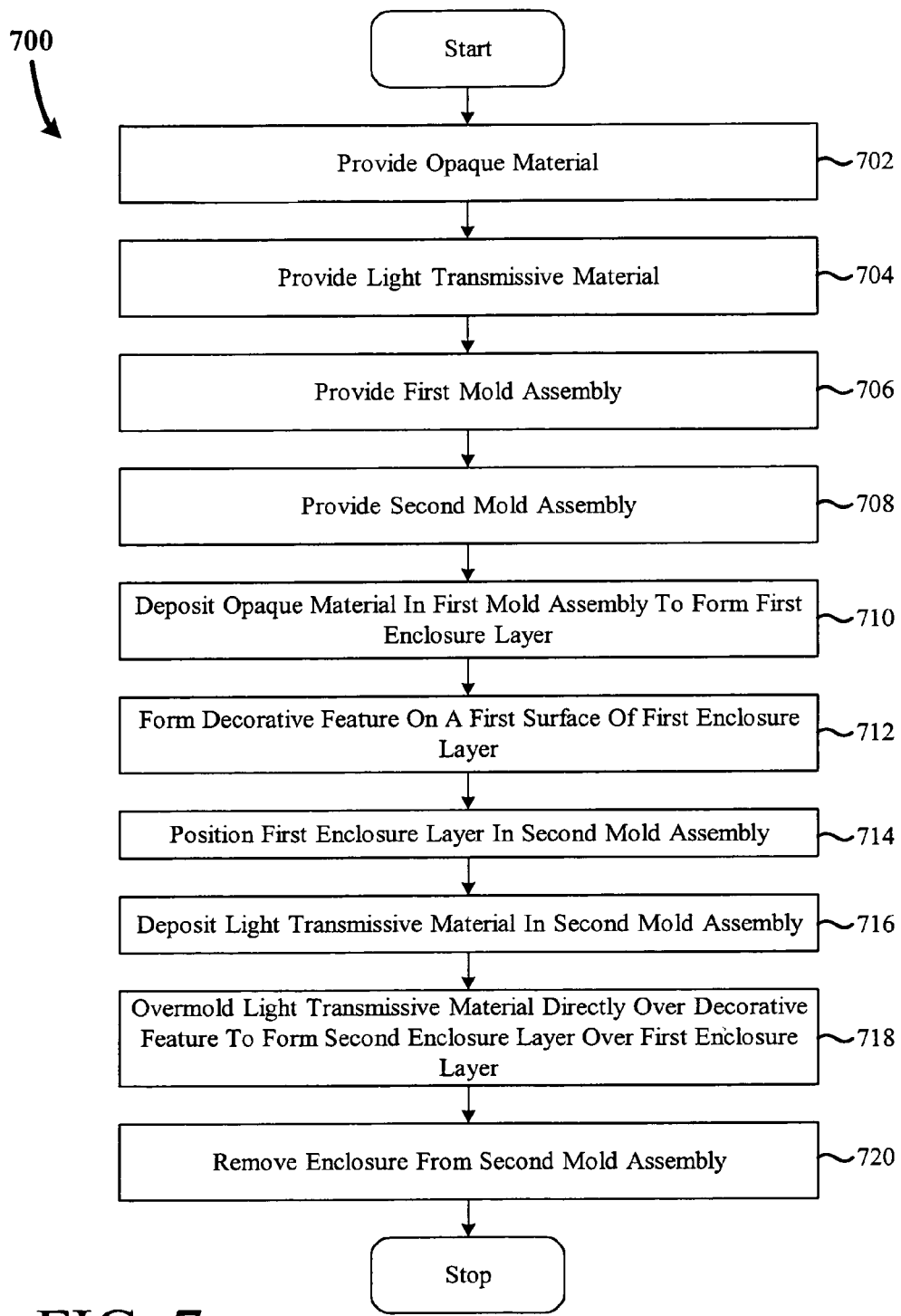
FIG. 7 is a flow chart summarizing one example method for manufacturing the electronic device enclosure 100 of FIG. 1.

FIG. 7 is a flow-diagram summarizing one method 700 for manufacturing a device enclosure. In a first step 702, an opaque material is provided. Then, in a second step 704, a light transmissive material is provided. Next, in a third step 706, a first mold assembly is provided. Then, in a fourth step 708, a second mold assembly is provided. Next, in a fifth step 710, the opaque material is deposited into the first mold assembly to form a first enclosure layer. Then, in a sixth step 712, a decorative feature is formed on a first surface of the first enclosure layer. Next, in a seventh step 714, the first enclosure layer is positioned in the second mold assembly. Then, in an eighth step 716, the light transmissive material is deposited in the second mold assembly. Next, in a ninth step 718, the light transmissive material is overmolded directly over the decorative feature to form a second enclosure layer over the first enclosure layer. Finally, in a tenth step 720, the enclosure is removed from the second mold assembly.

Figure 8:
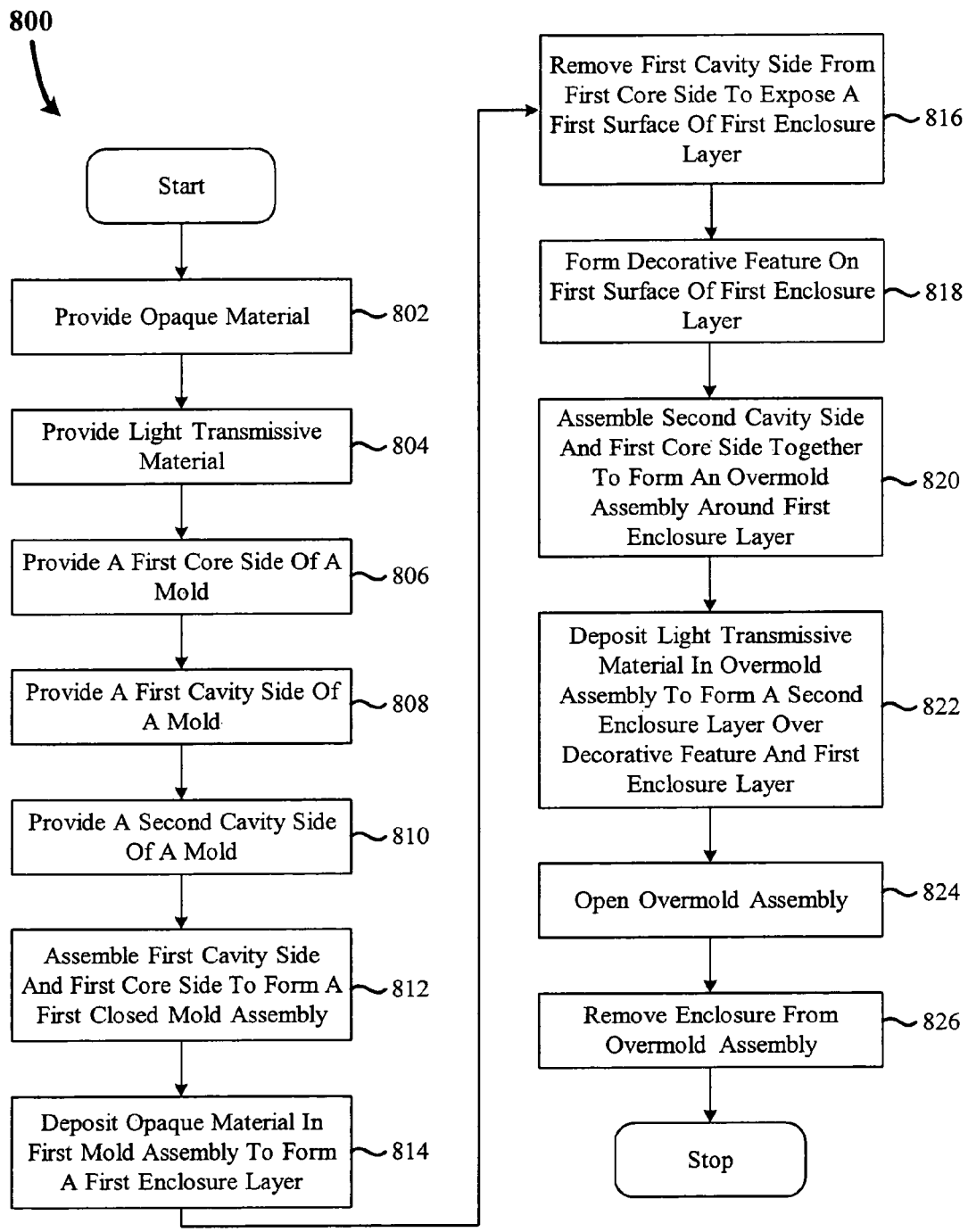
FIG. 8 is a flow chart summarizing another method for manufacturing the electronic device enclosure 100 of FIG. 1.

FIG. 8 is a flow-diagram summarizing another method 800 for manufacturing a device enclosure. In a first step 802, an opaque material is provided. Then, in a second step 804, a light transmissive material is provided. Next, in a third step 806, a first core side of a mold is provided. Then, in a fourth step 808, a first cavity side of a mold is provided. Next, in a fifth step 810, a second cavity side of a mold is provided. Then, in a sixth step 812, the first cavity side and the first core side are assembled to form a first closed mold assembly. Next, in a seventh step 814, the opaque material is deposited in the first mold assembly to form a first enclosure layer. Then, in an eighth step 816, the first cavity side is removed from the first core side to expose a first surface of the first enclosure layer. Next, in a ninth step 818, a decorative feature is formed on the first surface of the first enclosure layer. Then, in a tenth step 820, the second cavity side and the first core side are assembled together to form an overmold assembly around the first enclosure layer. Next, in an eleventh step 822, the light transmissive material is deposited in the overmold assembly to form a second enclosure layer over the decorative feature and the first enclosure layer. Then, in a twelfth step 824, the overmold assembly is opened. Finally, in a thirteenth step 826, the enclosure is removed from the overmold assembly.

Figure 9:
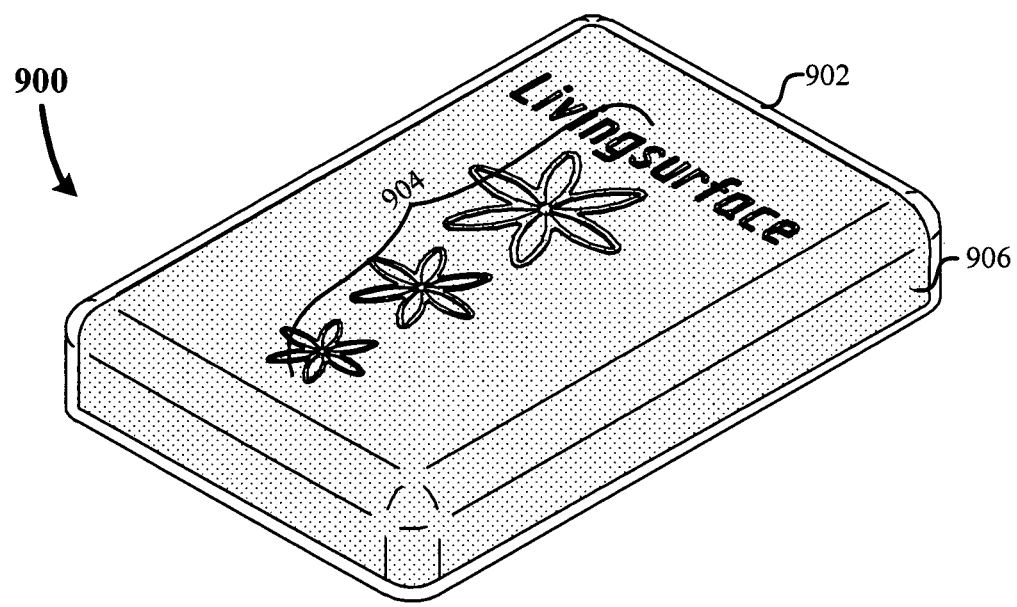
FIG. 9 is a perspective view of an electronic device enclosure 900 according to another embodiment of the present invention.

FIG. 9 shows a perspective view of an electronic device enclosure 900 according to one embodiment of the present invention. Enclosure 900 includes a first structural layer 902, a decorative feature 904, and second structural layer 906. First structural layer 902 is composed of light transmissive material which, in this particular example, is moldable plastic. Decorative feature 904 is formed directly on first structural layer 902 by some suitable means such as, for example, painting, pad/screen printing, dye sublimation, vacuum metallization, plating, laser marking, etc. Second layer 906 is an opaque plastic layer that is formed directly on first structural layer 902, over decorative feature 904. Accordingly, decorative feature 904 and second layer 906 are visible through first structural layer 902. This gives enclosure 900 an attractive appearance and also functions as a means to protect layer 906 and decorative feature 904.

Figure 10:
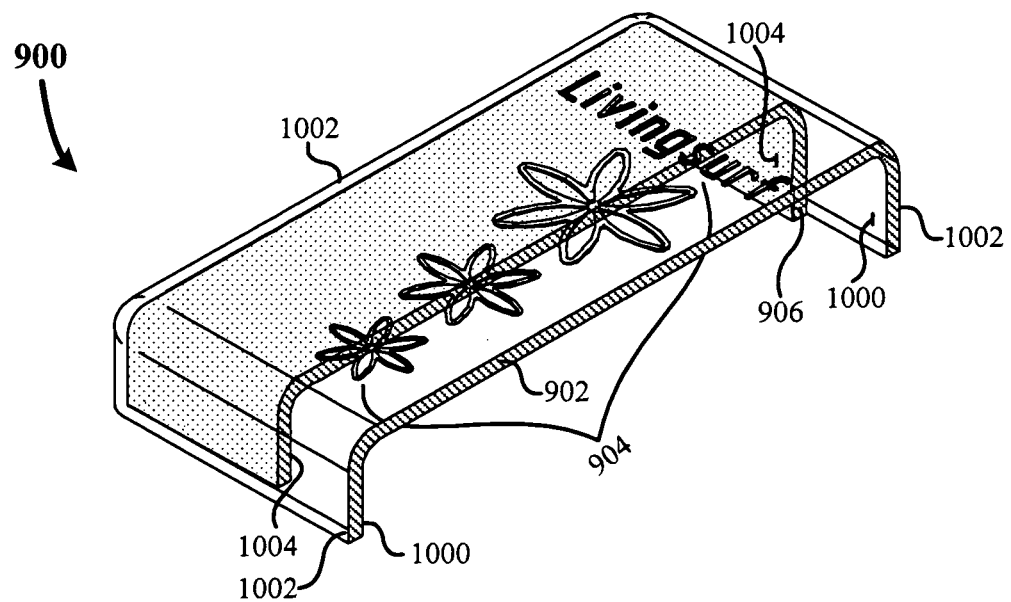
FIG. 10 is a sectioned perspective view of the electronic device enclosure 900 of FIG. 9.

FIG. 10 shows a perspective view of enclosure 900 sectioned through layers 902 and 906 to show details not visible in FIG. 9. Layer 902 includes a first surface 1000 and an opposite second surface 1002. First surface 1000 provides an area whereon both decorative feature 904 and layer 906 are formed. Of course, decorative feature 904 is formed on first surface 1000 before second layer 906. Second surface 1002 defines the exterior surface of enclosure 900. Second layer 906 includes a first surface 1004 that defines an interior surface of enclosure 900. Although not shown, surface 1004 could define various features such as mounting features (e.g., screw bosses, snap latches, fastener insert seats, etc.), assembly alignment features (e.g., studs/channels, component recesses, etc.), and support features (e.g., ribs, support columns, etc.).

Figure 11:
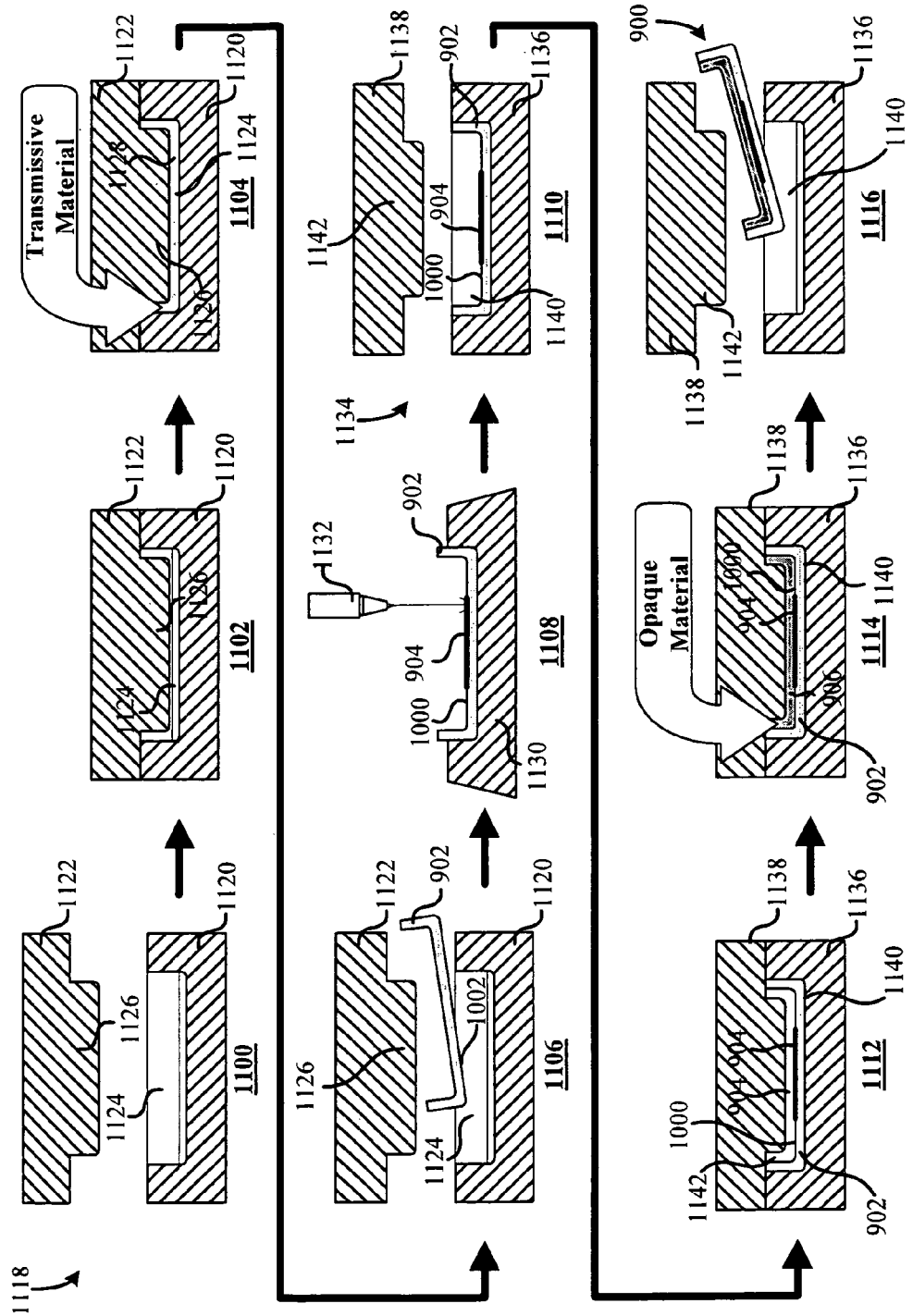
FIG. 11 is flow diagram illustrating a sequence of stages for manufacturing the electronic device enclosure 900 of FIG. 9 according to one example method of the present invention.

FIG. 11 is a process flow-diagram illustrating an example method for manufacturing enclosure 900. The example method is illustrated through a sequence of processes 1100, 1102, 1104, 1106, 1108, 1110, 1112, 1114, and 1116.

In process 1100, a first mold assembly 1118 is provided. Mold assembly 1118 includes a first cavity side 1120 and an associated first core side 1122. Cavity side 1120 includes a cavity 1124 that is contoured to define second surface 1002 of first layer 902. Core side 1122 includes a core 1126 that is contoured to define first surface 1000 of first layer 902.

Next, in process 1102, mold assembly 1118 is arranged in a closed position wherein cavity side 1120 and core side 1122 are coupled together. As shown, core 1126 has a slightly lesser volume than that of cavity 1124 such that a region of cavity 1124 remains unoccupied by core 1126 when mold assembly 1118 is closed.

Then, in process 1104, light transmissive plastic material 1128 is deposited into the unoccupied region of cavity 1124 by, for example, injecting the material through sprues formed in mold assembly 1118. After the plastic is deposited, mold assembly 1118 is kept closed while the deposited plastic cools to a predetermined temperature at which it solidifies into first layer 902.

Next, in process 1106, mold assembly 1118 is opened and first layer 902 is removed from cavity 1124.

Then, in process 1108, first layer 902 is held in a fixed position by a mounting fixture 1130 while decorative feature 904 is formed on first surface 1000 by a decorative feature application device 1132.

In the next process 1110, a second mold assembly 1134 is provided and decorated first layer 902 is positioned therein. Second mold assembly 1134 includes a cavity side 1136 and an associate core side 1138. Cavity side 1136 includes a cavity 1140 wherein first layer 902 is seated. Core side 1138 includes a core 1142 contoured to define first surface 1004 of second layer 906 which, as previously mentioned, is the interior exterior surface of enclosure 900.

Then, in process 1112, mold assembly 1134 is closed and clamped with first layer 902 positioned in cavity 1140. As shown, a separation exists between first surface 1000 and the walls of core 1142 when mold assembly 1134 is closed. This separation defines the space wherein second layer 906 is molded.

In the next process 1114, second layer 906 is formed by overmolding opaque material onto first surface 1000 of first layer 902, covering decorative feature 904. That is, melted opaque plastic is deposited into mold assembly 1134 so as to occupy the space between first surface 1000 and the walls of core 1142. Then, mold assembly 1134 is kept closed while the deposited plastic cools to a predetermined temperature at which it solidifies into second layer 906.

In a final process 1116, mold assembly 1134 is opened and enclosure 900 is removed from cavity 1140. The removal of mold assembly 1134 can be achieved by any suitable means such as, for example, an ejector pin, manually, etc.

Figure 12:
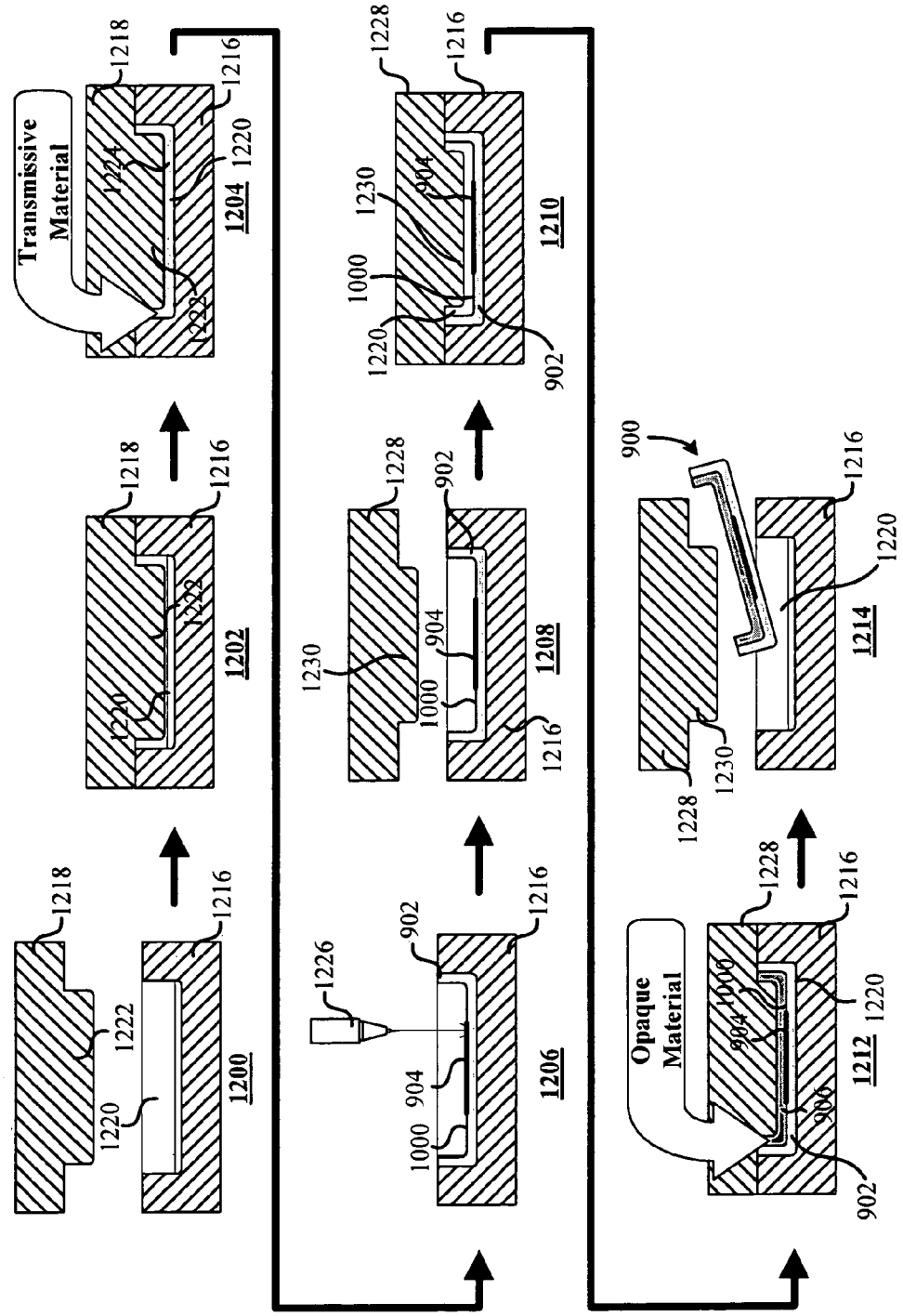
FIG. 12 is flow diagram illustrating a sequence of stages for manufacturing the electronic device enclosure 900 of FIG. 9 according to another example method of the present invention.

FIG. 12 is a process flow-diagram illustrating a method for manufacturing enclosure 900 according to another embodiment of the present invention. The example method is illustrated through a sequence of stages 1200, 1202, 1204, 1206, 1208, 1210, 1212, and 1214.

In method 1200, a first cavity side 1216 and an associated first core side 1218 are provided. Cavity side 1216 includes a cavity 1220 that is contoured to define second surface 1002 of first layer 902. Core side 1218 includes a core 1222 that is contoured to define first surface 1000 of first layer 902.

Next, in stage 1202, cavity side 1216 and core side 1218 are assembled into a closed position wherein core 1222 occupies a region of cavity 1220.

Then, in process 1204, light transmissive material 1224 is deposited into the unoccupied region of cavity 1220.

After the plastic is deposited, cavity side 1216 and core side 1218 remain in a closed position until the deposited plastic cools to a predetermined temperature at which it solidifies into first layer 902.

Next, in process 1206, core side 1218 is removed from first layer 902 and decorative feature 904 is formed on first surface 1000 by a decorative feature application device 1226.

In the next process 1208, a second core side 1228 is provided and positioned with respect to first cavity side 1216. Core side 1228 includes a core 1230 contoured to define first surface 1004 of second layer 906 which, as previously mentioned, is the inner exterior surface of enclosure 900. In particular, surface 1004 is one of two exterior surfaces (1002 and 1004) with respect to the actual molded component 900, but is disposed on the inner side of the enclosure.

Then, in process 1210, cavity side 1216 and core side 1228 are assembled and arranged in a closed position around first layer 902. As shown, a separation exists between first surface 1000 and the walls of cavity 1230 when cavity side 1216 and core side 1228 are arranged in a closed position. This separation defines the space wherein second layer 906 is molded.

In the next process 1212, second layer 906 is formed by overmolding opaque material over first surface 1000 of first layer 902 and decorative feature 904. That is, opaque material is deposited into the space between first surface 1000 and the walls of core 1230. Then, cavity side 1216 and core side 1228 are kept closed while the deposited plastic cools to a predetermined temperature at which it solidifies into second layer 906.

In a final process 1214, cavity side 1216 and core side 1228 are opened and enclosure 900 is removed. The removal of enclosure 900 can be achieved by any suitable means such as, for example, an ejector pin, manually, etc.

Figure 13:
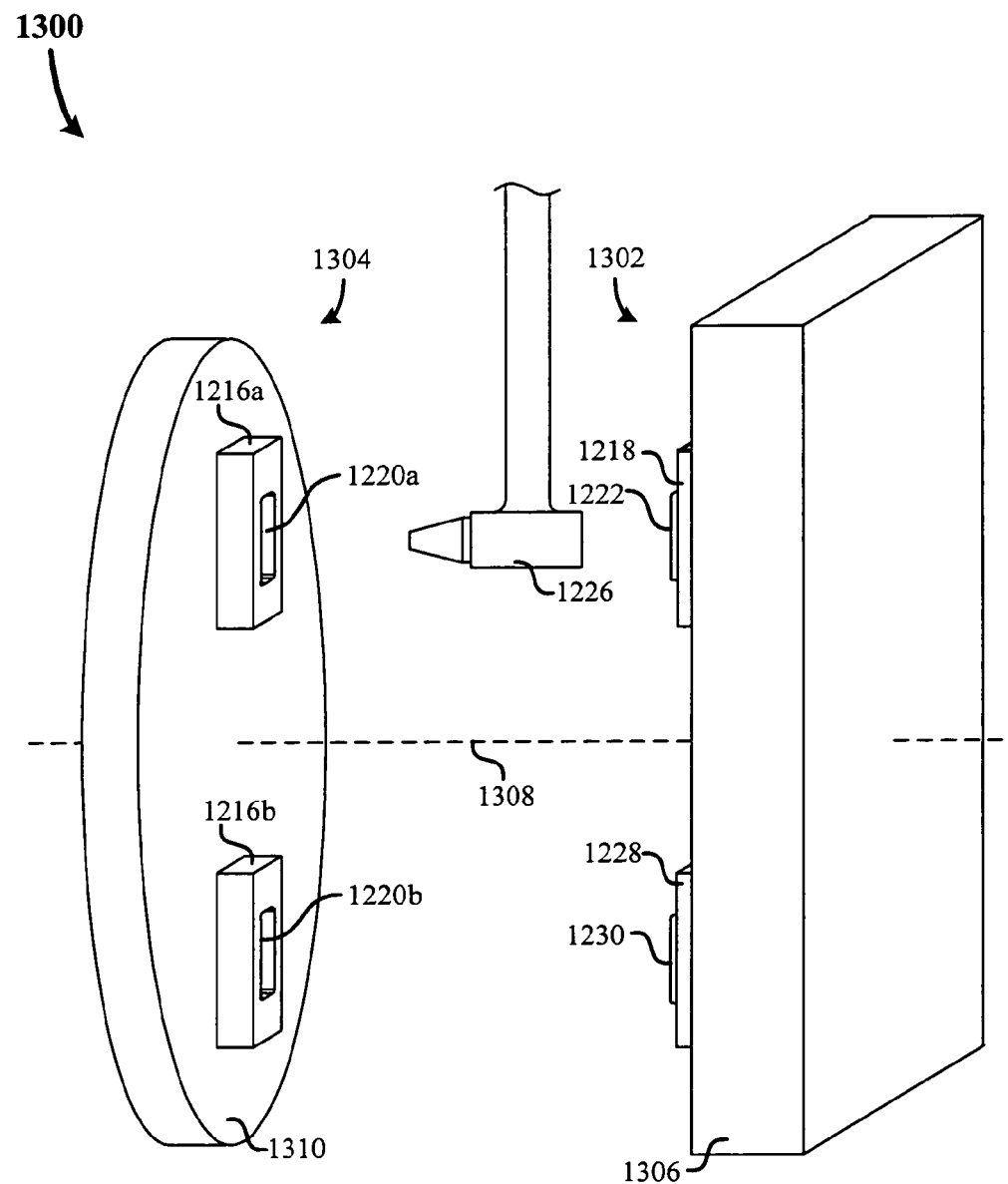
FIG. 13 is a perspective view of a double-shot rotary table molding machine 1300 for manufacturing the electronic device enclosure 900 of FIG. 9.

FIG. 13 shows a perspective view of a double-shot rotary table molding machine 1300 operative to manufacture enclosures 900 according to the method of FIG. 12. Molding machine 1300 includes a stationary assembly 1302, a rotatable assembly 1304, and decorative feature application device 1226. Stationary assembly 1302 includes core sides 1218 and 1228 fixably mounted on a stationary support plate 1306. Rotatable assembly 1304 includes two of mold cavities 1216 (denoted a and b) fixably mounted on a rotatable table 1310. During various operating stages of machine 1300, stationary plate 1306 remains fixed and centered with respect to an axis 1308 while table 1310 rotates about, and moves along, axis 1308.

An example operating cycle of machine 1300 is provided, assuming that one first layer 902 has already been formed and decorated in cavity side 1216*b*. With a decorated first layer 902 positioned in cavity 1220*b*, rotatable table 1310 is positioned such that cavity sides 1216*a* and 1216*b* are aligned across from, and facing, core sides 1218 and 1228, respectively. Then, table 1310 is arranged in a first closed position by moving it along axis 1308 toward plate 1306 until cores 1222 and 1230 are positioned in cavities 1220*a* and 1220*b*, respectively. Then, while in the first closed position, opaque material is deposited into cavity 1220*b* over the previously formed and decorated first layer 902 so as to form a second layer 906 of an enclosure 900. At the same time, a light transmissive material is deposited in cavity 1220a so as to form a first layer 902 of another enclosure 900. Then, table 1310 is moved back along axis 1308 into an open position wherein a completed enclosure 900 is formed in cavity 1220b and a first layer 902 of another enclosure 900 is formed in cavity 1220a. The completed enclosure is then removed while decoration application device 1226 is positioned with respect to cavity side 1216a and applies a decorative feature 904 on a first surface 1000 of the first layer 902. Then, table 1310 is rotated 180 degrees such that cavity sides 1216a and 1216b are aligned across from and facing cavity sides 1228 and 1218, respectively. Next, table 1310 is arranged in a second closed position by moving it along axis 1308 toward plate 1306 until cores 1230 and 1222 are positioned in cavities 1220a and 1220b, respectively. Then, while in the second closed position, opaque material is deposited into cavity 1220a over the previously formed and decorated first layer 902 so as to form a second layer 906 of an enclosure 900. At the same time, light transmissive material is deposited in cavity 1220b so as to form yet another first layer 902 of yet another enclosure 900. Then, table 1310 is moved back along axis 1308 into an open position wherein a completed enclosure 900 is formed in cavity 1220a and a first layer 902 of another enclosure is formed in cavity 1220b. The completed enclosure 900 is then removed while decoration application device 1226 applies a decorative feature 904 on yet another first layer 902 that will eventually undergo the same cycle.

Figure 14:
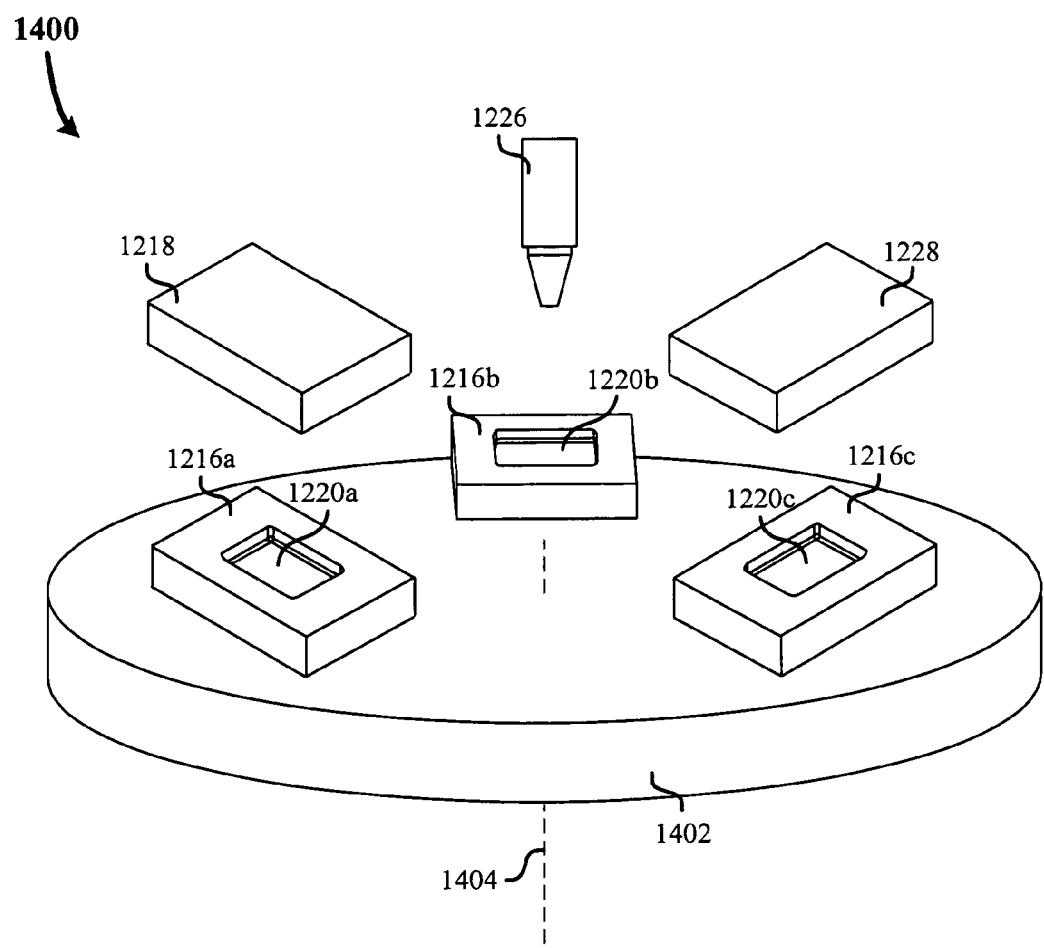
FIG. 14 is a perspective view of a three-position rotary table molding machine 1400 for manufacturing the electronic device enclosure 900 of FIG. 9.

FIG. 14 shows a perspective view of a three-position rotary table molding machine 1400 operative to manufacture enclosures 900 according to the method of FIG. 12. Molding machine 1400 includes a rotary table 1402 whereon three identical mold cavities 1216a, 1216b, and 1216c are fixably mounted. Rotary table 1402 is operative to sequentially change from a first position, to a second position, and then to a third position by rotating about an axis 1404. When a cavity is arranged in the first position, it is aligned with core side 1218 so as to form first layer 902. When a cavity is arranged in the second position, it is aligned with decorative feature application device 1226 so as to facilitate the formation of a decorative feature 904 on the previously formed first layer 902. When a cavity is arranged in the third position, it is aligned with core side 1228 so as to form second layer 906 over the previously formed and decorated first surface 1000 of first layer 902.

An example operating cycle of machine 1400 is provided. First, table 1402 is arranged such that cavity side 1216a is in the first position, cavity side 1216b is in the second position, and cavity side 1216c is in the third position. Core side 1218 is assembled with cavity side 1216a and opaque material is deposited into cavity 1220a so as to form a first layer 902. Then, after the opaque material solidifies, core side 1218 is raised off of first layer 902 and cavity side 1216a. Then, table 1402 is rotated such that cavity side 1216a is in the second position, cavity side 1216b is in the third position, and cavity side 1216c is in the first position. Once cavity side 1216a, having layer 902 formed therein, is in the second position, decorative feature application device 1226 applies a decorative feature 904 onto first surface 1000 of first layer 902. After decorative feature 904 is formed, table 1402 is rotated again such that cavity side 1216a is in the third position. Then, core side 1228 is assembled on cavity side 1216a and opaque material is deposited into cavity 1220a so as to overmold second layer 906 over decorated first layer 902. Then, core side 1228 is raised and the completed enclosure 900 is removed.

Note that table 1402 includes three core sides such that three different enclosures 900 can be undergoing fabrication at the same time. For example, while a first layer is being formed in one cavity, another first layer in a second cavity is undergoing decoration at the second position, and another decorated first layer positioned in the third cavity is undergoing the overmolding of the second layer. Accordingly, when machine 1400 operates at full capacity, a completed enclosure can be yielded every time table 1402 transitions from one position to the next.

Figure 15:
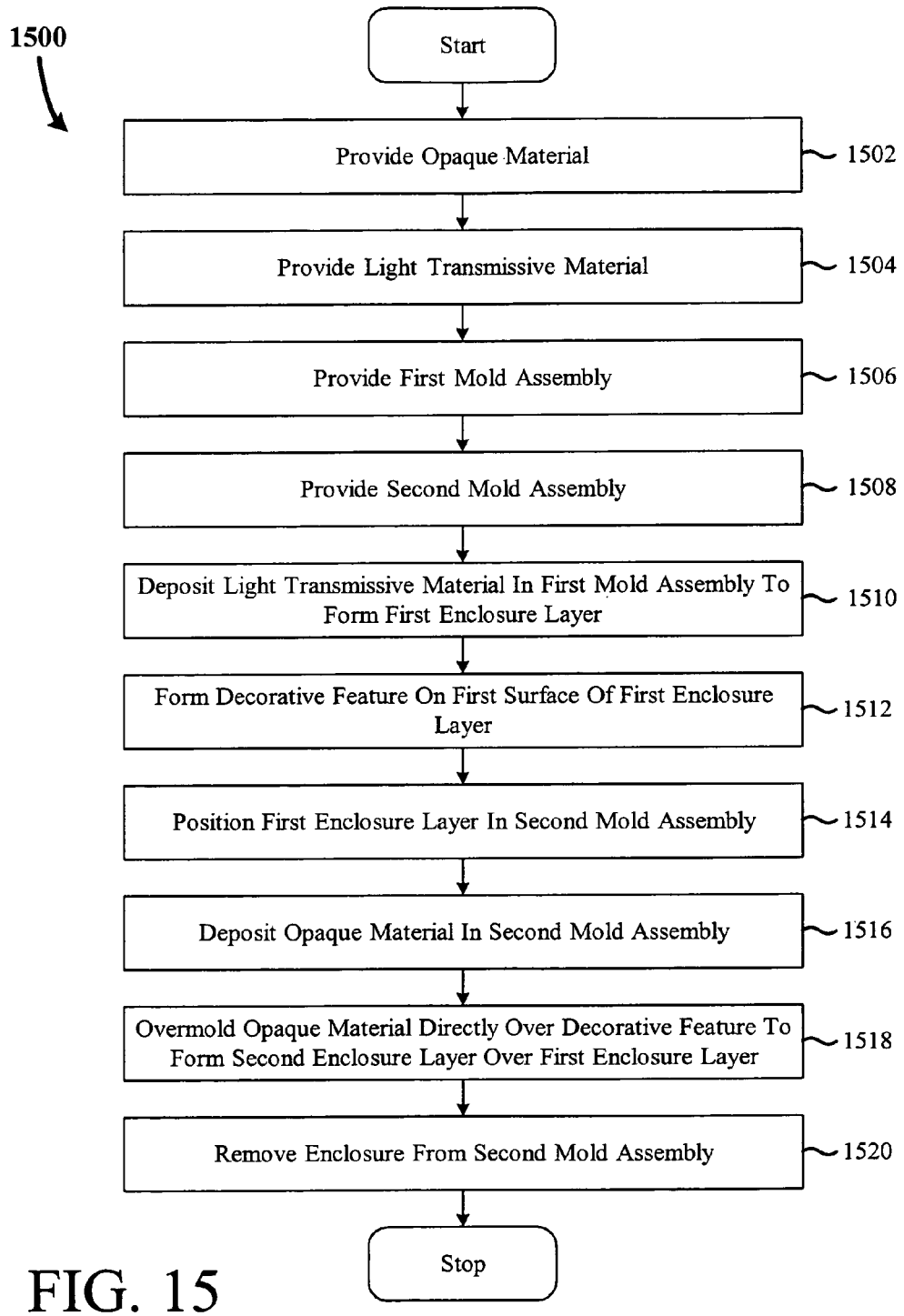
FIG. 15 is a flow chart summarizing one example method for manufacturing the electronic device enclosure 900 of FIG. 9.

FIG. 15 is a flowchart summarizing one example method 1500 for manufacturing a device enclosure. In a first step 1502, an opaque material is provided. Then, in a second step 1504, a light transmissive material is provided. Next, in a third step 1506, a first mold assembly is provided. Then, in a fourth step 1508, a second mold assembly is provided. Next, in a fifth step 1510, the light transmissive material is deposited into the first mold assembly to form a first enclosure layer. Then, in a sixth step 1512, a decorative feature is formed on a first surface of the first enclosure layer. Next, in a seventh step 1514, the first enclosure layer is positioned in the second mold assembly. Then, in an eighth step 1516, the opaque material is deposited in the second mold assembly. Next, in a ninth step 1518, the opaque material is overmolded directly over the decorative feature to form a second enclosure layer over the first enclosure layer. Finally, in a tenth step 1520, the enclosure is removed from the second mold assembly.

Figure 16:
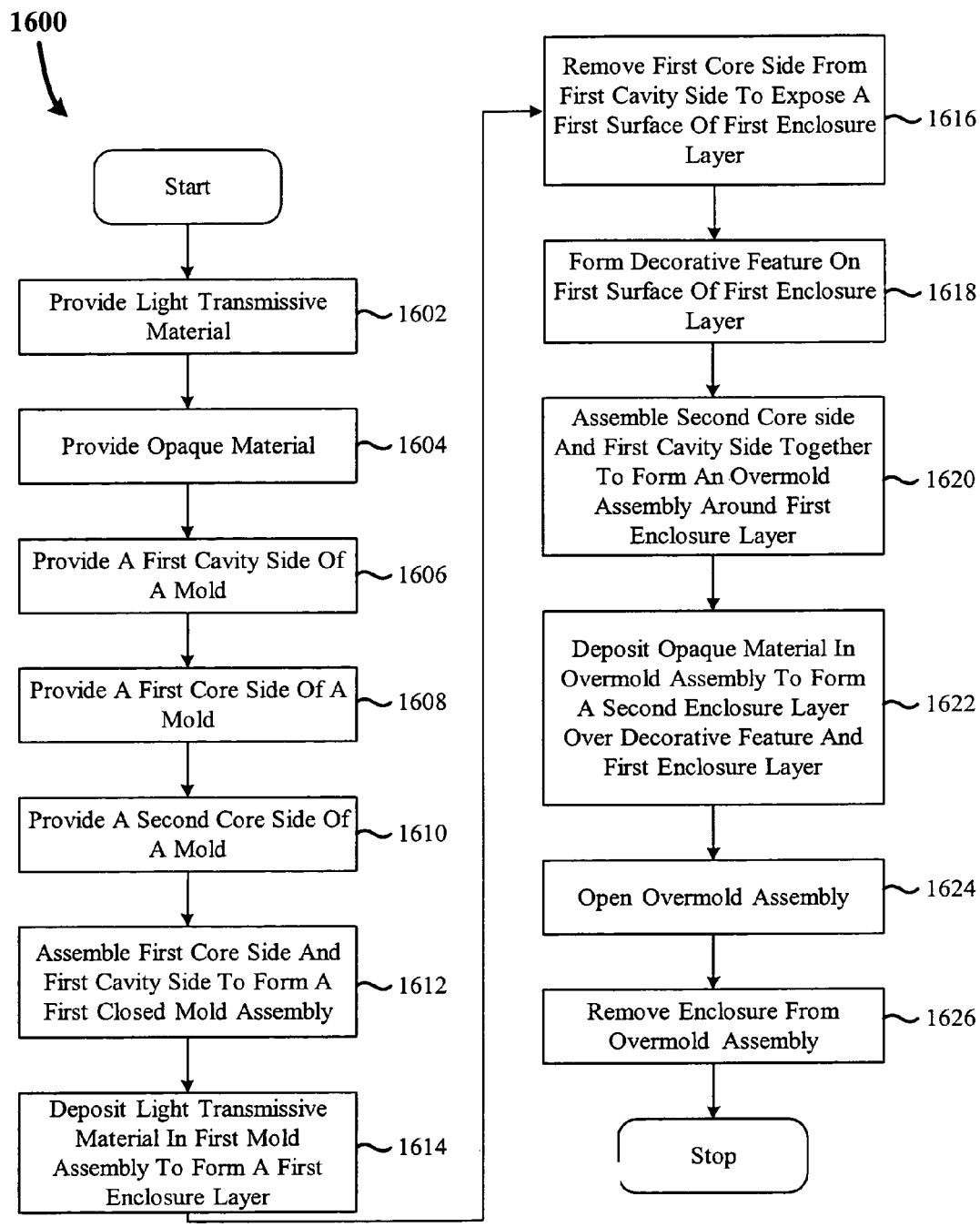
FIG. 16 is a flow summarizing another example method for manufacturing the electronic device enclosure 900 of FIG. 9.

FIG. 16 is a flowchart summarizing another example method 1600 for manufacturing a device enclosure. In a first step 1602, an opaque material is provided. Then, in a second step 1604, a light transmissive material is provided. Next, in a third step 1606, a first cavity side of a mold is provided. Then, in a fourth step 1608, a first core side of a mold is provided. Next, in a fifth step 1610, a second core side of a mold is provided. Then, in a sixth step 1612, the first core side and the first cavity side are assembled to form a first closed mold assembly. Next, in a seventh step 1614, the light transmissive material is deposited in the first mold assembly to form a first enclosure layer. Then, in an eighth step 1616, the first core side is removed from the first cavity side to expose a first surface of the first enclosure layer. Next, in a ninth step 1618, a decorative feature is formed on the first surface of the first enclosure layer. Then, in a tenth step 1620, the second core side and the first cavity side are assembled together to form an overmold assembly around the first enclosure layer. Next, in an eleventh step 1622, the opaque material is deposited in the overmold assembly to form a second enclosure layer over the decorative feature and the first enclosure layer. Then, in a twelfth step 1624, the overmold assembly is opened. Finally, in a thirteenth step 1626, the enclosure is removed from the overmold assembly.

The description of particular embodiments of the present invention is now complete. Many of the described features may be substituted, altered or omitted without departing from the scope of the invention. For example, electronic enclosures other than the examples shown can be made using the principles of the present invention. Indeed, the present invention can be used to make products other than electronic enclosures (toys, games, carrying cases, and so on). These and other deviations from the particular embodiments shown will be apparent to those skilled in the art, particularly in view of the foregoing disclosure.

We claim:

1. An electronic device enclosure comprising:
   a first structural layer having a first surface and a second surface;
   a decorative feature formed on said first surface of said first structural layer; and
   a second structural layer formed directly on said first surface of said first structural layer, said second structural layer being formed over said decorative feature by overmolding, wherein said second structural layer is light transmissive.

2. The electronic device enclosure of claim 1, wherein:
   said first structural layer is opaque;
   said first structural layer is formed by molding;
   said second surface of said first structural layer defines an inner exterior surface of said electronic device enclosure;
   said second structural layer defines an outer exterior surface of said electronic device enclosure opposite said inner exterior surface of said electronic device enclosure; and
   said decorative feature is formed by laser marking.

3. The electronic device enclosure of claim 1, wherein:
   said first structural layer is opaque;
   said first structural layer is formed by molding;
   said second surface of said first structural layer defines an inner exterior surface of said electronic device enclosure;
   said second structural layer defines an outer exterior surface of said electronic device enclosure opposite said inner exterior surface of said electronic device enclosure; and
   said decorative feature is formed by dye sublimation.

4. The electronic device enclosure of claim 1, wherein said decorative feature is visible through said second structural layer.

5. The electronic device enclosure of claim 4, wherein said first layer is visible through said second structural layer.

6. The electronic device enclosure of claim 5, wherein said first layer is opaque.

7. The electronic device enclosure of claim 1, wherein said second surface of said first structural layer defines an inner exterior surface of said electronic device enclosure.

8. The electronic device enclosure of claim 1, wherein said second structural layer defines an outer exterior surface of said electronic device enclosure.

9. The electronic device enclosure of claim 1, wherein said first structural layer is composed of plastic and is formed by molding.

10. The electronic device enclosure of claim 1, wherein said decorative feature is formed by laser marking.

11. The electronic device enclosure of claim 1, wherein said decorative feature is formed by dye sublimation.

12. The electronic device enclosure of claim 1, wherein:
    said first structural layer is light transmissive;
    said first structural layer is formed by molding;
    said second surface of said first structural layer defines an outer exterior surface of said electronic device enclosure;
    said second structural layer is opaque;
    said second structural layer defines an inner exterior surface of said electronic device enclosure opposite said outer exterior surface of said electronic device enclosure; and
    said decorative feature is formed by laser marking.

13. The electronic device enclosure of claim 1, wherein:
    said first structural layer is light transmissive;
    said first structural layer is formed by molding;
    said second surface of said first structural layer defines an outer exterior surface of said electronic device enclosure;
    said second structural layer is opaque;
    said second structural layer defines an inner exterior surface of said electronic device enclosure opposite said outer exterior surface of said electronic device enclosure; and
    said decorative feature is formed by dye sublimation.

14. The electronic device enclosure of claim 1, wherein said second structural layer is opaque.

15. The electronic device enclosure of claim 14, wherein said decorative feature is visible through said second surface of said first structural layer.

16. The electronic device enclosure of claim 15, wherein said second structural layer is visible through said first structural layer.

17. The electronic device enclosure of claim 16, wherein said first layer is light transmissive.

18. The electronic device enclosure of claim 14, wherein said second surface of said first structural layer defines an outer exterior surface of said electronic device enclosure.

19. The electronic device enclosure of claim 14, wherein said second structural layer defines an inner exterior surface of said electronic device enclosure.

20. The electronic device enclosure of claim 14, wherein said first structural layer is composed of plastic and is formed by molding.

21. The electronic device enclosure of claim 14, wherein said decorative feature is formed by laser marking.

22. The electronic device enclosure of claim 14, wherein said decorative feature is formed by dye sublimation.

23. A method for manufacturing an electronic device enclosure, said method comprising:
    providing a first substrate material;
    providing a second substrate material;
    forming said first substrate material into a first structural layer of said device enclosure, said first structural layer having a first surface and an opposite second surface;
    forming a decorative feature on said second surface of said first structural layer of said device enclosure; and
    forming a second structural layer of said device enclosure by overmolding said second substrate material on said second surface of said first structural layer of said device enclosure, said second structural layer defining a first exterior surface of said device enclosure, said decorative feature being disposed between said first structural layer of said device enclosure and said second structural layer of said device enclosure.

24. The method of claim 23, wherein said step of forming said first structural layer includes:
    providing a first mold assembly, said first mold assembly including a first mold core and a first mold cavity;
    closing said first mold assembly; and
    depositing said first substrate material in said first mold assembly.

25. The method of claim 24, wherein said step of forming said second structural layer includes:
    providing a second mold assembly, said second mold assembly including a second mold cavity and a second mold core;
    positioning said first structural layer in said second mold assembly after said step of forming said decorative feature;

closing said second mold assembly; and depositing said second substrate material in said second mold assembly.

26. The method of claim 25, wherein:

said first mold core is contoured to define said first surface of said first structural layer;

said first mold cavity is contoured to define said second surface of said first structural layer; and said second mold cavity is contoured to define a first surface of said second structural layer, said first surface of said second structural layer defining an outer exterior surface of said device enclosure.

27. The method of claim 25, wherein:

said first mold cavity is contoured to define said first surface of said first structural layer, said first surface of said first structural layer defining an outer exterior surface of said device enclosure;

said first mold core is contoured to define said second surface of said first structural layer; and said second mold core is contoured to define a first surface of said second structural layer, said first surface of said second structural layer defining an inner exterior surface of said device enclosure.

28. The method of claim 25, wherein said step of forming said decorative feature includes:

providing a mounting fixture, mounting said first structural layer in said mounting fixture after said first structural layer is formed in said first mold assembly and removed from said first mold assembly, and forming said decorative feature on said second surface of said first structural layer while said first structural layer is mounted in said fixture.

29. The method of claim 25, wherein said step of forming said decorative feature includes forming said decorative feature by laser etching.

30. The method of claim 25, wherein said step of forming said decorative feature includes forming said decorative feature by dye sublimation.

* * * * *